United States Patent
Kando et al.

(10) Patent No.: US 8,074,341 B2
(45) Date of Patent: Dec. 13, 2011

(54) BOUNDARY ACOUSTIC WAVE DEVICE MANUFACTURING METHOD

(75) Inventors: Hajime Kando, Ritto (JP); Masakazu Mimura, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 196 days.

(21) Appl. No.: 12/429,313

(22) Filed: Apr. 24, 2009

(65) Prior Publication Data

US 2009/0200894 A1    Aug. 13, 2009

Related U.S. Application Data

(63) Continuation of application No. PCT/JP2007/071106, filed on Oct. 30, 2007.

(30) Foreign Application Priority Data

Nov. 24, 2006   (JP) ................. 2006-316957

(51) Int. Cl.
  *H04R 31/00* (2006.01)
(52) U.S. Cl. ........... 29/594; 29/595; 29/609.1; 205/119; 205/122; 310/366; 310/320; 333/150; 333/187; 333/193; 333/195; 333/196
(58) Field of Classification Search .............. 29/25.35, 29/594, 595, 609.1; 333/150, 187, 193, 195, 333/196; 310/313, 320, 366; 205/119, 122
See application file for complete search history.

(56) References Cited

U.S. PATENT DOCUMENTS

| | | |
|---|---|---|
| 4,933,588 A | 6/1990 | Greer |
| 5,010,270 A | 4/1991 | Greer |
| 5,260,913 A * | 11/1993 | Kadota et al. ................. 367/140 |
| 5,918,354 A | 7/1999 | Ikegami et al. |
| 7,262,676 B2 | 8/2007 | Ruile et al. |
| 2006/0071579 A1 | 4/2006 | Kando |
| 2007/0018536 A1 | 1/2007 | Kadota et al. |
| 2007/0176711 A1 | 8/2007 | Kando |
| 2007/0222337 A1 | 9/2007 | Kadota et al. |

FOREIGN PATENT DOCUMENTS

| | | |
|---|---|---|
| JP | 63-246911 A | 10/1988 |
| JP | 02-224514 A | 9/1990 |
| JP | 09-107264 A | 4/1997 |
| JP | 09-326668 A | 12/1997 |
| JP | 2000-295060 A | 10/2000 |
| JP | 2001-077661 A | 3/2001 |
| JP | 2005-150787 A | 6/2005 |
| WO | WO 2004070946 A1 * | 8/2004 |
| WO | 2006/114930 A1 | 11/2006 |

OTHER PUBLICATIONS

Official Communication issued in International Patent Application No. PCT/JP2007/071106, mailed on Feb. 5, 2008.

* cited by examiner

*Primary Examiner* — Paul D Kim
(74) *Attorney, Agent, or Firm* — Keating & Bennett, LLP

(57) ABSTRACT

A method for manufacturing a boundary acoustic wave device includes the steps of preparing a laminated structure in which an IDT electrode is disposed at an interface between first and second solid media and reforming the first medium and/or the second medium by externally providing the laminated structure with energy capable of reaching the inside of the first medium and/or the second medium and thus adjusting a frequency of the boundary acoustic wave device. The above provides a boundary acoustic wave device manufacturing method that enables frequency adjustment to be readily performed with high accuracy.

7 Claims, 10 Drawing Sheets

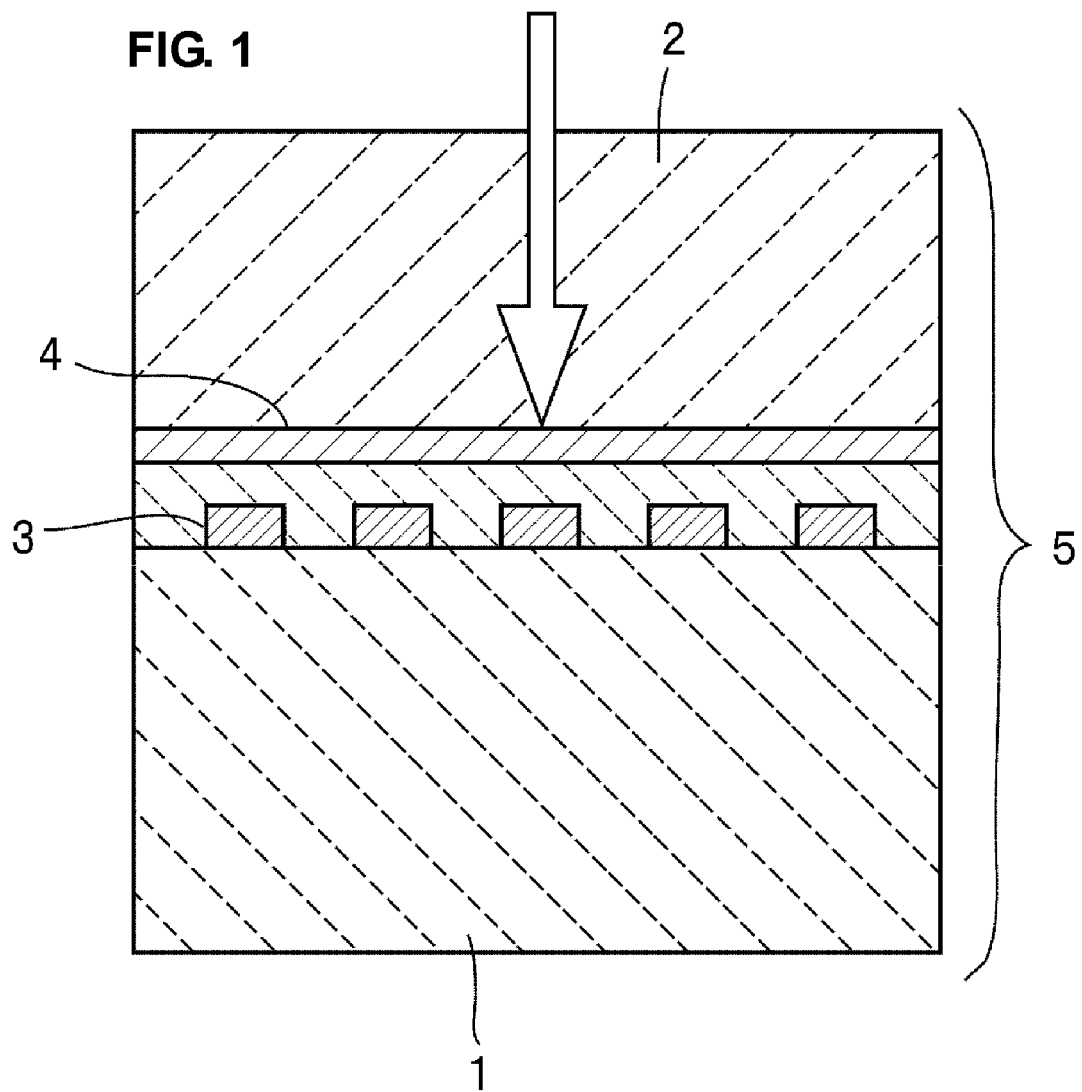

BOUNDARY ACOUSTIC WAVE DEVICE MANUFACTURING METHOD

BACKGROUND OF THE INVENTION

1. Field of the Invention

The present invention relates to a method for manufacturing a boundary acoustic wave device utilizing a boundary acoustic wave propagating through an interface between first and second solid media and relates to a boundary acoustic wave device. More specifically, the present invention relates to a boundary acoustic wave device manufacturing method including a step of adjusting frequency characteristics and relates to a boundary acoustic wave device.

2. Description of the Related Art

A surface acoustic wave device is widely used as a band-pass filter or a resonator, for example, in a cellular phone. In a surface acoustic wave device, an interdigital transducer (IDT) electrode is disposed on a piezoelectric substrate, and the IDT electrode receives and excites a surface acoustic wave. Accordingly, in order to avoid interference with reception and excitation of a surface acoustic wave, it is necessary to have a space above a portion where the IDT electrode is disposed.

When a surface acoustic wave device is used as a band-pass filter or a resonator, the frequency of the surface acoustic wave device must be controlled with high accuracy. Accordingly, after the surface acoustic wave device is produced, a mass load member may be provided to the piezoelectric substrate or the electrode may be processed for the purpose of adjusting the frequency.

Japanese Unexamined Patent Application Publication No. 2001-77661 discloses a method by which a frequency can be adjusted after a surface where an IDT electrode of a surface acoustic wave device is disposed is sealed with a cap. FIG. 12 is a schematic front cross-sectional view for describing the frequency adjusting method described in Japanese Unexamined Patent Application Publication No. 2001-77661. It is noted that hatching indicating a cross section is omitted in this drawing, which schematically illustrates the cross section.

According to the frequency adjusting method described in Japanese Unexamined Patent Application Publication No. 2001-77661, a surface acoustic wave device 501 includes a piezoelectric substrate 502, an IDT electrode 503 disposed on the piezoelectric substrate 502, and a cap member 504 attached above the piezoelectric substrate 502 such that a space S is present above the IDT electrode 503. That is, an adhesive 505 is applied to seal the space S and surround a portion where the IDT electrode 503 is disposed, and the cap member 504 is bonded to the piezoelectric substrate 501 by the adhesive 505.

Accordingly, it is difficult to adjust the frequency by processing the portion where the IDT electrode 503 is disposed after the surface acoustic wave device 501 is produced. However, in Japanese Unexamined Patent Application Publication No. 2001-77661, the frequency is adjusted after the cap member 504 is bonded to the piezoelectric substrate 501. Here, a substance 506 that is vaporized by being heated by a laser beam is applied on the inner surface of the cap member 504 in advance. The cap member 504 is made of a light-transmitting material that allows a laser beam to pass therethrough. When the surface acoustic wave device 501 is irradiated with a laser beam emitted from thereabove using a laser apparatus 507, the laser beam transmits through the cap member 504. Accordingly, the substance 506 is heated by the laser beam, vaporized, and deposited on the IDT electrode 503 positioned therebelow. By controlling the irradiation energy of this laser beam, it is possible to adjust the frequency, according to Japanese Unexamined Patent Application Publication No. 2001-77661.

Nowadays, attention is being given to a boundary acoustic wave device, instead of a surface acoustic wave device. For example, WO 2004/070946 discloses a boundary acoustic wave device that includes an IDT electrode arranged at an interface between first and second solid media and that uses a boundary acoustic wave propagating through the interface. In this boundary acoustic wave device, the IDT electrode is arranged at the interface between the first and second solid media, and there is no need to have a space to which the IDT electrode is exposed.

It is unnecessary for a boundary acoustic wave device to have a space to which an IDT electrode is exposed. Accordingly, a boundary acoustic wave device can be more compact when compared with a surface acoustic wave device and can have a simplified package structure.

When a boundary acoustic wave device is used as a filter or a resonator, it is also necessary to set its frequency with high accuracy. However, in the boundary acoustic wave device, an IDT electrode is embedded at an interface between first and second solid media and there is no space to which the IDT electrode is exposed. Accordingly, the frequency adjusting method for use in the surface acoustic wave filtering device described in Japanese Unexamined Patent Application Publication No. 2001-77661 is inapplicable to the boundary acoustic wave device.

That is, in the surface acoustic wave device, there is no second medium above the IDT, and the surface portion of the IDT and the piezoelectric substrate, which allow an elastic wave to pass therethrough, faces a space. Reforming to change the acoustic velocity of the surface portion of the IDT and the piezoelectric substrate can be performed from the space side. If such frequency adjustment is applied to a boundary acoustic wave device, a portion of the second medium that is opposite to the interface to the first medium would be reformed, and the second medium positioned at the interface through which a boundary acoustic wave propagates could not be reformed.

Accordingly, traditionally, it has been necessary to manufacture a boundary acoustic wave device that can exhibit desired characteristics with high accuracy in manufacturing thereof. There is no known effective method for adjusting frequency characteristics after manufacturing.

SUMMARY OF THE INVENTION

In light of the circumstances described above, preferred embodiments of the present invention provide a boundary acoustic wave device manufacturing method and a resulting boundary acoustic wave device that enable frequency characteristics to be adjusted with high accuracy.

According to a preferred embodiment of the present invention, a method for manufacturing a boundary acoustic wave device includes a first medium, a second medium laminated on the first medium, and an interdigital transducer (IDT) electrode arranged at an interface between the first medium and the second medium and utilizing a boundary acoustic wave that propagates through the interface includes the steps of preparing a laminated structure in which the IDT electrode is arranged at the interface between the first medium and the second medium and reforming the first medium and/or the second medium by externally providing the laminated structure with energy capable of reaching the inside of the first medium and/or the second medium and thus adjusting a frequency of the boundary acoustic wave device.

In a method for manufacturing a boundary acoustic wave device according to a preferred embodiment of the present invention, in the step of reforming the first medium and/or the second medium by externally providing the first medium and/or the second medium with the energy and thus adjusting the frequency of the boundary acoustic wave device, the energy may preferably be concentrated on a portion of the first medium and/or the second medium, thus reforming the portion of the first medium and/or the second medium. In this case, because the concentration of the energy on the portion of the first medium and/or the second medium reforms that portion, the frequency can be adjusted more largely and reliably.

A method for manufacturing a boundary acoustic wave device according to a preferred embodiment of the present invention may preferably further include the step of forming a reform medium layer in the first medium and/or the second medium. In the step of reforming the first medium and/or the second medium and thus adjusting the frequency, the reforming may preferably be performed by the provision of the energy to the reform medium layer. In this case, forming the reform medium layer from a material that is easy to be reformed enables the frequency adjustment to be performed by the provision of energy more reliably and readily.

In a method for manufacturing a boundary acoustic wave device according to a preferred embodiment of the present invention, when a wavelength of the IDT electrode is $\lambda$, in reforming the first medium and/or the second medium and thus adjusting the frequency, the reforming may preferably be performed by the provision of the energy to a region within a distance of $\lambda$ from the interface in a direction in which the first medium and the second medium are laminated. Because the energy of a boundary acoustic wave is concentrated on the region within a distance of $\lambda$ from the interface in the direction in which the first medium and second medium are laminated, the reforming can be effectively performed by the provision of the energy to the region within a distance of $\lambda$ from the interface.

In a method for manufacturing a boundary acoustic wave device according to a preferred embodiment of the present invention, a femtosecond laser beam may preferably be used as the energy. In such a case, the femtosecond laser beam can be emitted from outside the first medium and/or the second medium, and the energy of femtosecond laser beam can be readily and reliably guided to a region where reforming is desired.

In a method for manufacturing a boundary acoustic wave device according to a preferred embodiment of the present invention, a light absorption wavelength of the reform medium layer may preferably be different from a light absorption wavelength of the first medium and/or the second medium, in which the reform medium layer is disposed. The reforming may preferably be performed by concentration of a laser beam defining the energy on the reform medium layer, and the laser beam may preferably have a wavelength at which the reform medium layer absorbs the laser beam. In this case, the use of the laser beam having a wavelength at which the reform medium layer absorbs the laser beam can prevent the energy of the laser beam from being absorbed in the first medium and/or the second medium and enables the energy of the laser beam to be effectively absorbed in the reform medium layer in reforming.

Preferably, each of the reform medium layer and the first medium and/or the second medium may be made of a material that is reformed by heat, and a temperature at which the reform medium layer reforms may be lower than a temperature at which the first medium and/or the second medium, in which the reform medium layer is disposed, reforms. In this case, the reform medium layer is heated by the energy of laser beam irradiation, for example. A temperature at which the reform medium layer reforms is lower than a temperature at which the first medium and/or the second medium reforms. Thus, the reform medium layer can be reformed more effectively, and frequency characteristics can be adjusted.

A boundary acoustic wave device according to a preferred embodiment of the present invention includes a first medium, a second medium laminated on the first medium, and an IDT electrode arranged at an interface between the first medium and the second medium. The boundary acoustic wave device further includes a reformed portion disposed in the first medium and/or the second medium, reformed by externally provided energy, and achieving frequency characteristics different from frequency characteristics exhibiting when the boundary acoustic wave device includes only the first medium and/or the second medium.

In a boundary acoustic wave device according to a preferred embodiment of the present invention, the reformed portion may preferably be obtained by reforming of a portion of the first medium and/or the second medium. In this case, another material is not necessary in reforming the portion of the first medium and/or the second medium. Accordingly, without causing an increase in cost and complication of a manufacturing process, a boundary acoustic wave device that has frequency characteristics controlled with high accuracy can be provided.

In a boundary acoustic wave device according to a preferred embodiment of the present invention, the reformed portion may preferably be obtained using a reform medium different from the first medium and/or the second medium and configured by reforming of the reform medium. In this case, forming the reformed portion by reforming the reform medium that is reformed by the provision of energy more readily than the first medium and/or the second medium can adjust frequency characteristics more reliably and reliably.

In a boundary acoustic wave device according to a preferred embodiment of the present invention, when a wavelength of the IDT electrode is $\lambda$, the reformed portion may preferably be disposed within a distance of $\lambda$ from the interface. Because the energy of a boundary acoustic wave is concentrated on the region within a distance of $\lambda$ from the interface in the direction in which the first medium and second medium are laminated, when the reformed portion is disposed in the region within a distance of $\lambda$ from the interface, frequency characteristics can be adjusted more readily and reliably. Accordingly, a boundary acoustic wave device that has frequency characteristics controlled with higher accuracy can be provided.

With a method for manufacturing a boundary acoustic wave device according to a preferred embodiment of the present invention, externally providing energy capable of reaching the inside of the first medium and/or the second medium after preparing the laminated structure in which the IDT electrode is disposed between the first and second media reforms the first medium and/or the second medium, thereby adjusting the frequency of the boundary acoustic wave device. Accordingly, externally providing such energy transmitting through the medium enables the frequency adjustment of the boundary acoustic wave device to be performed with high accuracy.

In manufacturing many boundary acoustic wave devices, the adjustment of frequency characteristics of obtained boundary acoustic wave devices using the above-described method enables boundary acoustic wave devices having uniform frequency characteristics to be supplied with stability.

A boundary acoustic wave device according to a preferred embodiment of the present invention includes the reformed portion disposed in the first medium and/or the second medium, reformed by externally provided energy, and achieving frequency characteristics different from frequency characteristics exhibited when the boundary acoustic wave device includes only the first medium and/or the second medium. Accordingly, boundary acoustic wave devices whose variations in frequency characteristics are reduced can be obtained simply by frequency adjustment using externally provided energy after the laminated structured is obtained in accordance with a manufacturing method in accordance with a preferred embodiment of the present invention.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 schematically illustrates a method for manufacturing a boundary acoustic wave device according to one preferred embodiment of the present invention.

DETAILED DESCRIPTION OF THE PREFERRED EMBODIMENTS

Figure 2A:
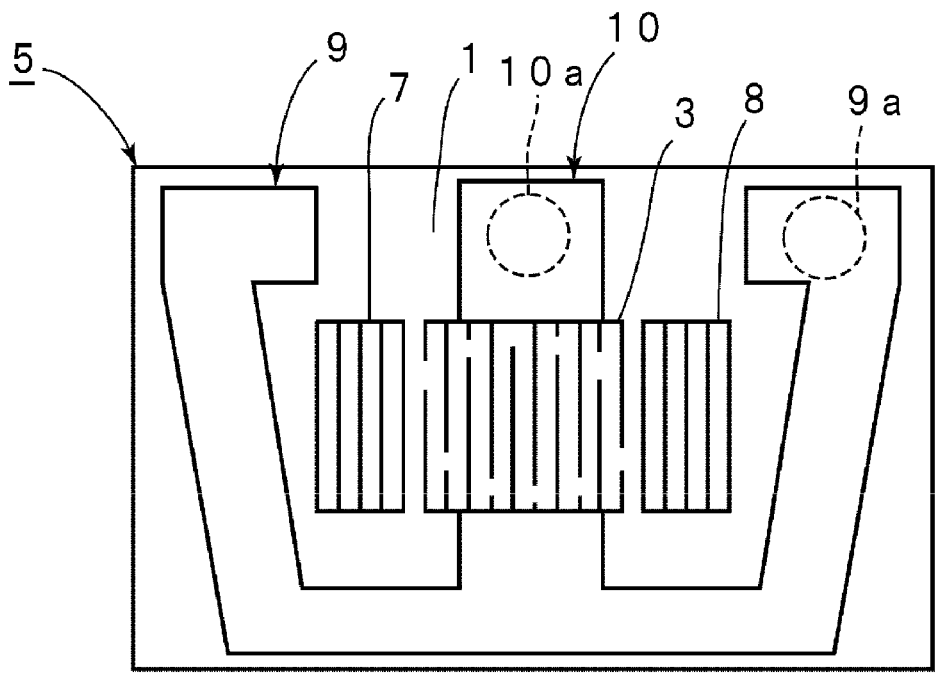
FIGS. 2A and 2B are a schematic top cross-sectional view and a schematic front cross-sectional view, that respectively illustrate the boundary acoustic wave device according to a first preferred embodiment in a state before laser beam irradiation.

The present invention is described below using explanation of specific preferred embodiments of the present invention with reference to the drawings.

FIG. 1 is a front cross-sectional view that schematically illustrates a method for manufacturing a boundary acoustic wave device according to one preferred embodiment of the present invention.

According to the manufacturing method in the present preferred embodiment, a laminated structure 5 illustrated in FIG. 1 is first prepared. In the laminated structure 5, a second medium 2 preferably made of silicon dioxide ($SiO_2$) is laminated on a first medium 1 preferably made of lithium niobate ($LiNbO_3$). An interdigital transducer (IDT) electrode 3 is arranged between the first medium 1 and the second medium 2. The IDT electrode 3 is preferably made of gold.

A reform medium layer 4 is disposed in the second medium 2. When being subjected to laser beam irradiation, the reform medium layer 4 is reformed. In the present preferred embodiment, the reform medium layer 4 is preferably made of gold. The second medium 2 is preferably made of $SiO_2$ and allows light to transmit therethrough.

Figure 3A:
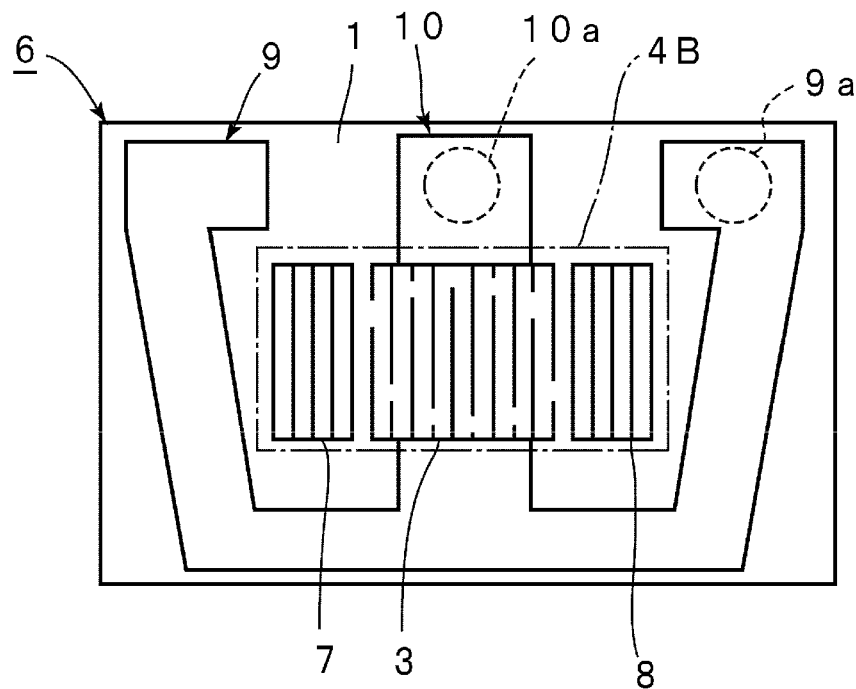
FIGS. 3A and 3B are a schematic top cross-sectional view and a schematic front cross-sectional view, that respectively illustrate the boundary acoustic wave device obtained according to the first preferred embodiment.
Figure 3B:
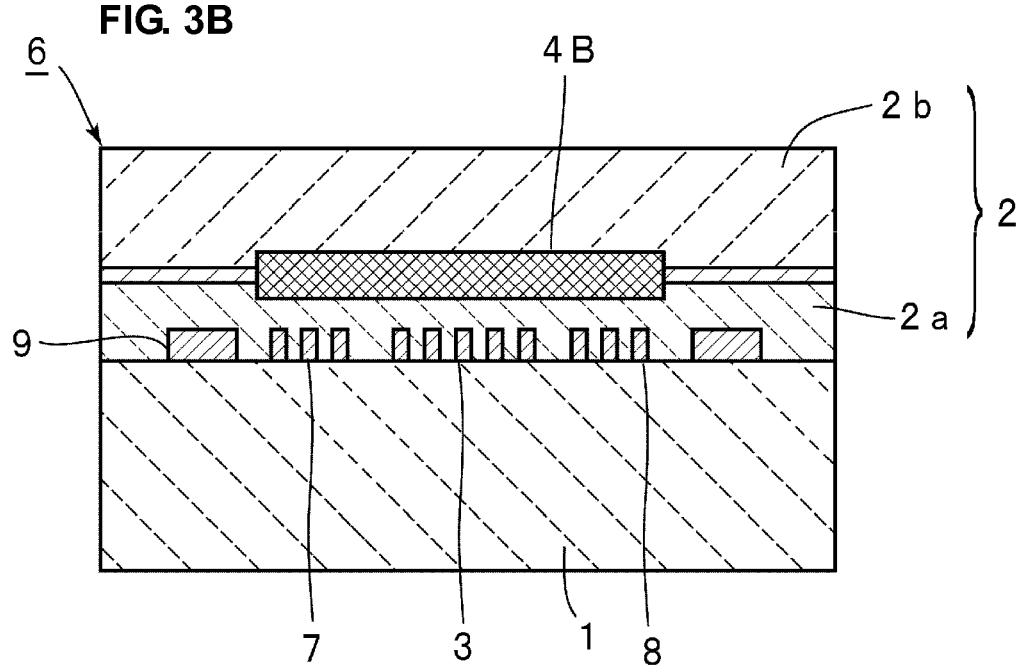

After the laminated structure 5 illustrated in FIG. 1, i.e., the laminated structure 5 in which the IDT electrode 3 is arranged at the interface X between the first medium 1 and the second medium 2 and the reform medium layer 4 is arranged in the second medium 2 is prepared, the laminated structure 5 is irradiated with a laser beam emitted through the outer surface of the second medium 2, as indicated by the arrow. The laser beam irradiation heats the reform medium layer 4, and gold forming the reform medium layer 4 is diffused into the second medium 2. In such a way, a portion that is reformed by laser beam irradiation, i.e., a reformed portion is produced in the reform medium layer 4. The use of the reformed portion enables frequency characteristics of a boundary acoustic wave device 6 illustrated in FIG. 3 to be adjusted.

Accordingly, after the laminated structure 5 is obtained, the frequency adjustment can be readily achieved simply by externally applied laser beam irradiation.

As previously described, in a surface acoustic wave device, there is no second medium above an IDT, and the surface region of the IDT and the piezoelectric substrate through which an elastic wave propagates opposes a space. Reforming that changes the acoustic velocity of the IDT and the piezoelectric substrate can be achieved from the space side. If such frequency adjustment is applied in a boundary acoustic wave device, a portion of the second medium that is opposite to the interface to the first medium would be reformed and the second medium positioned at the interface through which a boundary acoustic wave propagates could not be reformed.

In contrast to this, according to the present preferred embodiment, disposing the reform medium layer 4 in the second medium 2 and making the second medium of a light-transmitting material, such as $SiO_2$, for example, enables reforming to be performed in the reform medium layer 4 by laser beam irradiation. Accordingly, after the laminated structure 5 is obtained, the frequency of the boundary acoustic wave device 6 can be readily adjusted. Thus, boundary acoustic wave devices whose variations in frequency characteristics are reduced can be provided.

When receiving energy from laser beam irradiation, the reform medium layer 4 is reformed in itself. In the above preferred embodiment, this reforming is achieved by diffusion of gold forming the reform medium layer 4 into the surroundings. Accordingly, the above reforming indicates not only changing of the nature of the reform medium layer 4 but also reforming of the second medium portion adjacent to the reform medium layer 4.

In the above preferred embodiment, the reform medium layer 4 is disposed in the second medium 2. However, the reform medium layer 4 may be disposed in the first medium 1, or alternatively, may be disposed in both of the first medium 1 and the second medium 2. If the reform medium layer 4 is disposed in the first medium, a laser beam can be emitted from outside the first medium 1.

The reform medium layer 4 can be made of various kinds of material as long as the material is reformed by an energy providing unit, such as a laser, for example, more readily than the second medium, in which the reform medium layer 4 is arranged.

A method for manufacturing a boundary acoustic wave device according to the present preferred embodiment is described more specifically with reference to FIGS. 2A to 8.

Figure 2B:
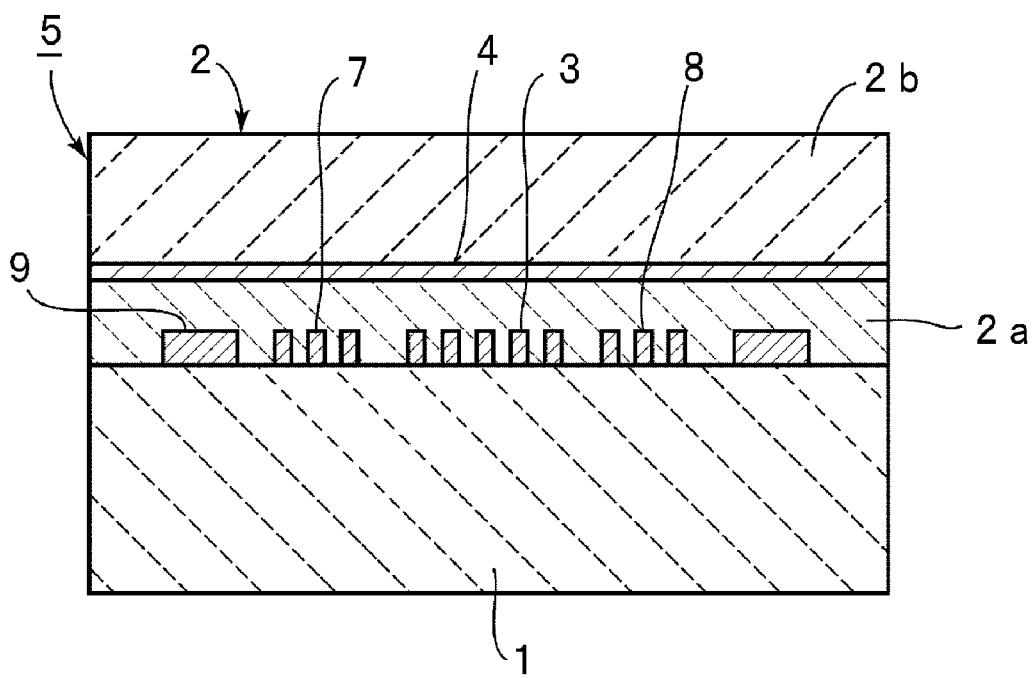

FIGS. 2A and 2B are a schematic top cross-sectional view and a schematic front cross-sectional view that respectively illustrate a detailed structure of the laminated structure 5 before laser beam irradiation.

The laminated structure 5 has a structure in which the first medium 1 and the second medium 2 are laminated. Here, the first medium 1 is preferably made of 15° Y-cut X-propagation LiNbO$_3$ as a piezoelectric single crystal. When the wavelength determining the pitch of the electrode fingers of the IDT electrode about 3 is λ, the thickness of the first medium 1 is about 4λ to about 100λ.

The second medium 2 is disposed above and below the reform medium layer 4 and is preferably made of SiO$_2$. A lower second medium 2a disposed below to cover the IDT electrode 3 preferably has a thickness of 2 μm=0.625λ, and an upper second medium 2b, which is preferably made of the same SiO$_2$, has a thickness of 4 μm=1.25λ, for example.

The reform medium layer 4 is preferably made of gold and has a thickness of about 20 nm.

The period, i.e., wavelength λ of the IDT electrode 3 to excite a boundary acoustic wave preferably is about 3.2 μm and the duty is about 0.5, for example. As illustrated in FIG. 2A, the IDT electrode 3 is crossing-width weighted. That is, the cross-width weighting is performed such that the crossing-width of the IDT electrode 3 at the central section is about 30λ and the crossing-width of the IDT electrode 3 at the opposite ends in the direction in which boundary waves propagate is about 12λ, for example. The number of pairs of the electrode fingers of the IDT electrode 3 is preferably 50, for example. Reflectors 7 and 8 are arranged at the opposite sides of the IDT electrode 3 in the direction in which boundary waves propagate. The number of the electrode fingers of each of the reflectors 7 and 8 is preferably 51.

The IDT electrode 3 and the reflectors 7 and 8 are formed from a laminated metal film composed predominantly of gold. That is, the laminated metal film is used in which a NiCr film having a thickness of about 10 nm is laminated above and below a gold film having a thickness of about 150 nm, for example.

In manufacturing, the IDT electrode 3, the reflectors 7 and 8, and wiring patterns 9 and 10 are first formed on the lithium niobate as the first medium 1 by photolithography. After that, the silicon dioxide layer 2a is preferably formed by sputtering.

Then, a gold film having a thickness of about 20 nm is formed on the silicon dioxide layer 2a by electron-beam vapor deposition, for example, and thus the reform medium layer 4 is formed.

Then, the silicon dioxide layer 2b is preferably formed on the reform medium layer 4 by sputtering. In such a way, the second medium 2, in which the reform medium layer 4 is disposed and which is made out of the silicon dioxide layers 2a and 2b, is formed.

Then, the silicon dioxide layer 2b and the reform medium layer 4 on electrode pads 9a and 10a of the wiring patterns 9 and 10 for electrically connecting to an outside element are removed by photolithography. In such a way, the electrode pads 9a and 10a are exposed, and they can be electrically connected to an outside element.

The electrode pads 9a and 10a are connected to a measuring apparatus, and frequency characteristics of the laminated structure obtained in such a way are measured. After that, the laminated structure 5 is irradiated with a laser beam emitted from above the silicon dioxide layer 2b.

Figure 4:
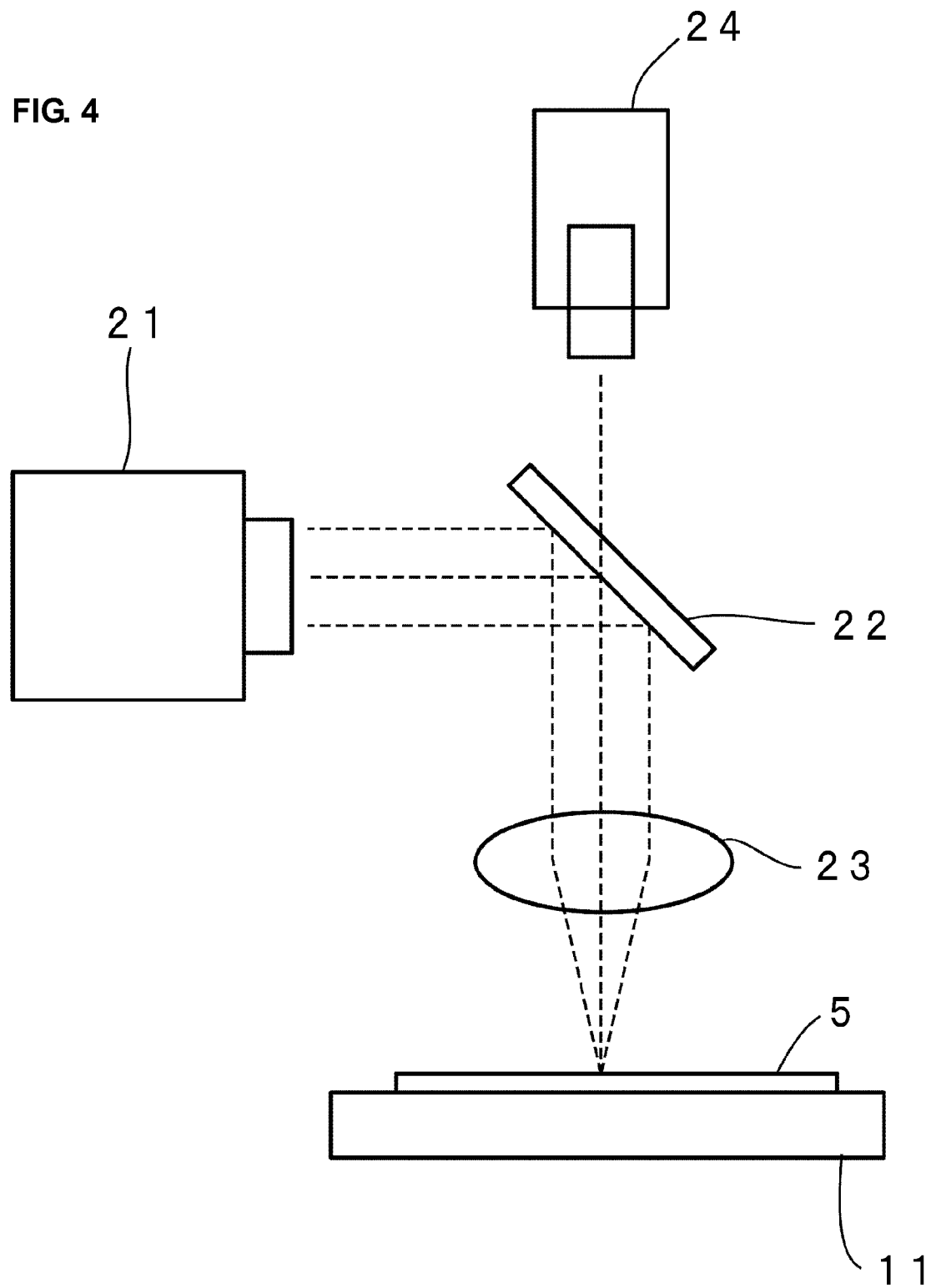
FIG. 4 is a schematic diagram of an apparatus for emitting a laser beam in the first preferred embodiment of the present invention.

An apparatus for emitting a laser beam is illustrated in FIG. 4. The laminated structure 5 manufactured in the above-described way before its frequency is adjusted is arranged on a stage 11 movable in XYZ directions. The laminated structure 5 is irradiated with a laser beam emitted by a laser apparatus 21 and reflected from a reflecting mirror 11. The laser beam being focused by a lens 23 reaches the laminated structure 5. In this case, the lens 23 is disposed so as to focus a laser beam such that its energy converges on a portion of the second medium 2.

Figure 5A:
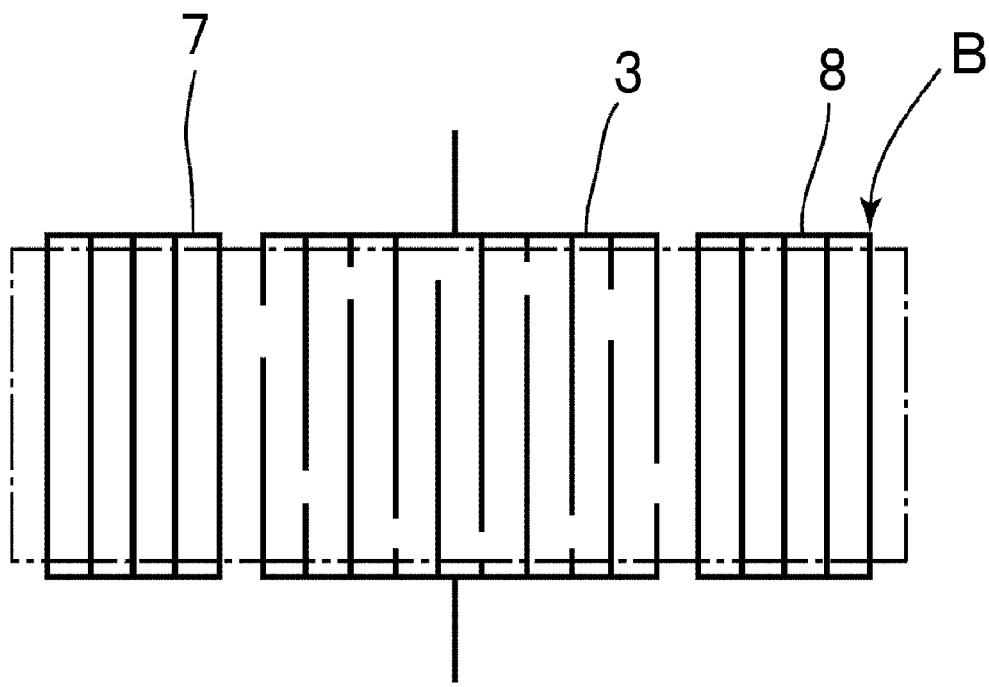
FIGS. 5A and 5B are schematic plan views that illustrate a scanning method using a laser beam in the first preferred embodiment of the present invention.
Figure 5B:
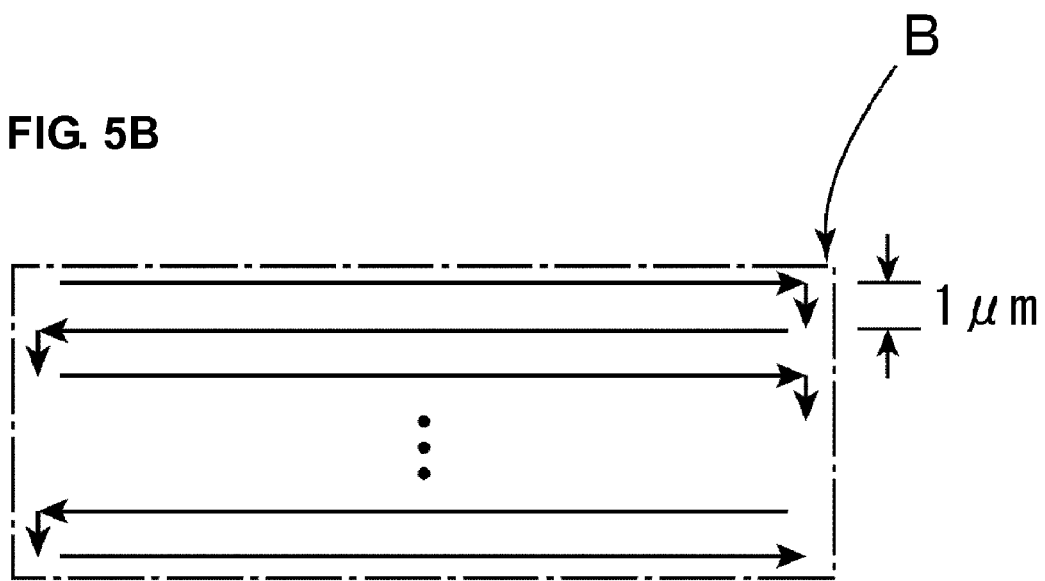

The stage 11 is moved in the XYZ directions while the laminated structure 5 is being irradiated with the laser beam, so that the region irradiated with the laser beam is moved. The region scanned with the laser beam is a region indicated by alternate long and short dashed lines B schematically illustrated in FIGS. 5A and 5B, i.e., the region where the IDT electrode 3 and the reflectors 7 and 8 are disposed. As illustrated in FIG. 5B, the region surrounded by the alternate long and short dashed lines B is scanned with a laser beam at a speed of about 5 mm/sec in the direction in which boundary acoustic waves propagate and its opposite direction at intervals of about 1 μm in a direction perpendicular or substantially perpendicular to the direction in which boundary acoustic waves propagate.

Figure 6:
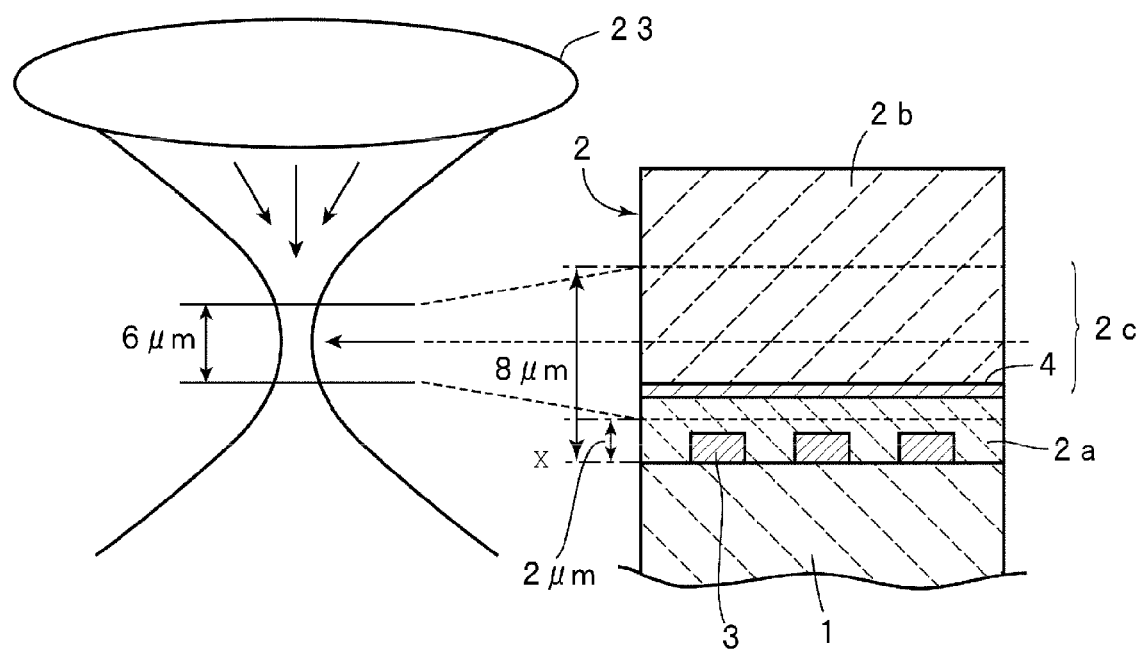
FIG. 6 is a schematic diagram that schematically illustrates a region on which a laser beam is focused according to the first preferred embodiment of the present invention.

As illustrated in FIG. 6, the energy of a laser beam emitted through the lens 23 is provided such that the focus of the laser beam matches with in a reform target portion 2c in the second medium 2. The reform target portion 2c ranges from the height position about 2 μm distant from the interface X to the height position about 8 μm distant from the interface X, for example. The focus matches with the height position about 5 μm distant from the interface X, for example.

The reason why the focus of the laser beam is positioned about 5 μm above the interface X, as described above, is that the reform medium layer 4 is located inside a reform target region.

A half mirror that allows an irradiation state of a laser beam to be observed from behind is preferably used as the reflecting mirror 22. A microscope 24 is preferably arranged behind the reflecting mirror 22. The laser beam irradiation region is observed by the microscope 24.

An apparatus that can emit a femtosecond laser beam having a central wavelength of about 1560 nm, a pulse width of about 900 femtoseconds, and a period of about 350 Hz with an output of about 200 mW is preferably used as the laser apparatus 21, for example. The use of the femtosecond laser beam enables adjustment of the focus with high accuracy. Accordingly, the laser beam can be emitted while its energy converges on a region to be reformed with high accuracy.

In such a way, the energy of a laser beam converges on the region that matches the focus, i.e., the reform target region. As a result, as illustrated in a state after laser beam irradiation shown in FIGS. 3A and 3B, which are schematic top and front cross-sectional views, respectively, in the portion irradiated with the laser beam in the reform medium layer 4, gold is preferably diffused into the surroundings, and a portion that has a high gold density, i.e., a reformed portion 4B expands in the second medium 2 in its thickness direction. After such reforming, the electrode pads 9*a* and 10*a* are connected to the measuring apparatus, and frequency characteristics of the boundary acoustic wave device 6 are measured by the measuring apparatus. The results are illustrated in FIG. 7.

Figure 7:
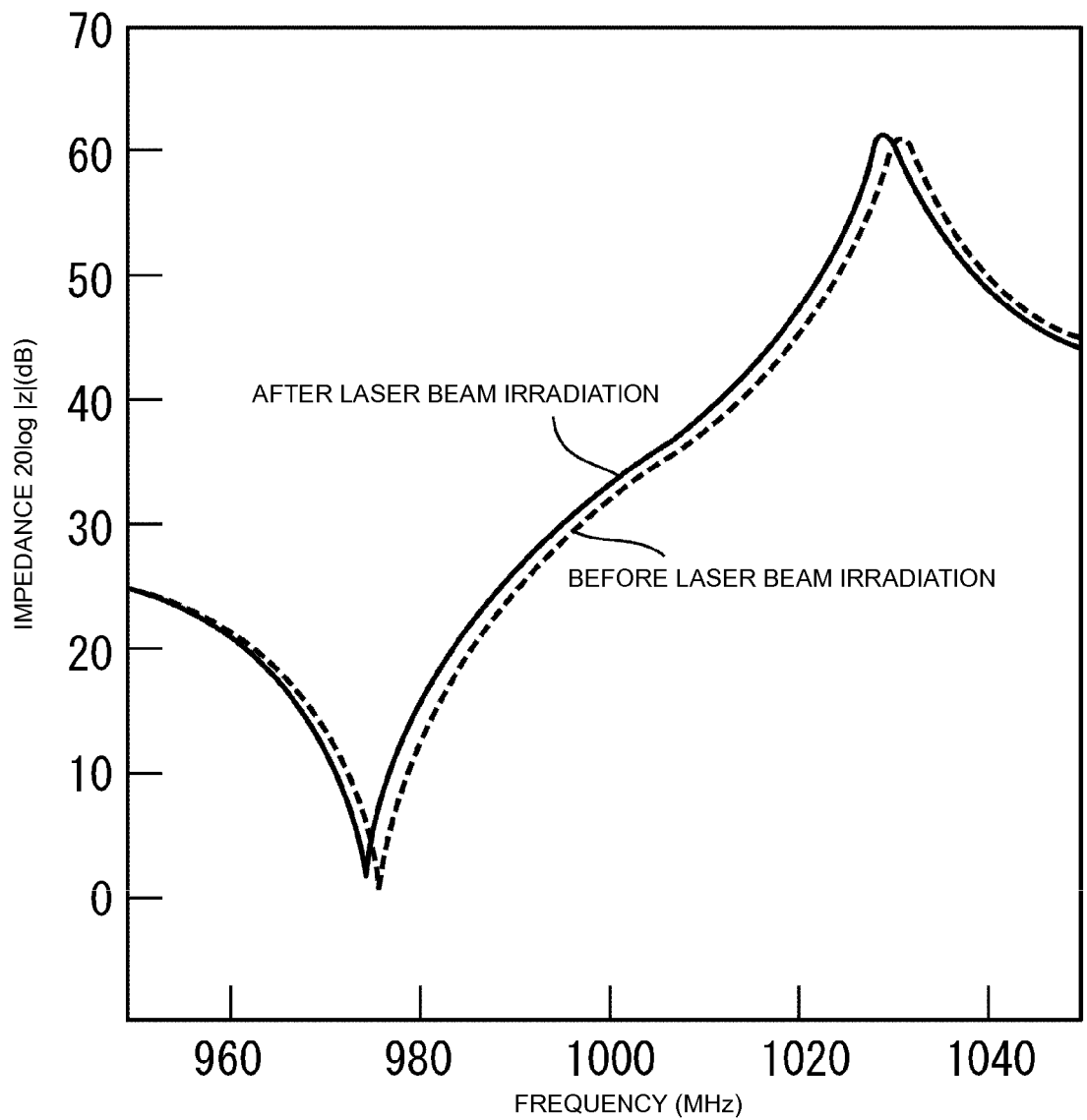
FIG. 7 illustrates resonance characteristics of the boundary acoustic wave device according to the first preferred embodiment before and after laser beam irradiation.

FIG. 7 also illustrates impedance characteristics before the above reforming step. The resonant resistance, anti-resonant frequency, and anti-resonant resistance before and after laser beam irradiation, and the amount of change in each of them are listed in Table 1.

TABLE 1

|  | Resonant Frequency (MHz) | Resonant Resistance (dB) | Anti-resonant Frequency (MHz) | Anti-resonant Resistance (dB) |
| --- | --- | --- | --- | --- |
| After Laser Beam Irradiation | 975.31 | 0.79 | 1031.56 | 61.0 |
| Before Laser Beam Irradiation | 974.38 | 1.65 | 1029.69 | 61.61 |
| Amount of Change | −0.94 | 0.86 | −1.88 | 0.60 |

Accordingly, the results reveal that the resonant frequency and the anti-resonant frequency are reduced by approximately 1 MHz to approximately 2 MHz by irradiation of the above femtosecond laser beam and a frequency adjustment of approximately 1000 ppm to approximately 2000 ppm, for example, can be performed.

Preferably, the material of the reform medium layer 4 may be selected such that the temperature at which the reform medium layer 4 reforms is lower than the temperature at which the second medium 2 reforms. In this case, when the temperature of the reform medium layer 4 is increased by energy of a laser beam, the adjustment of the energy of the laser beam enables the reform medium layer 4 to be reformed at a temperature lower than that of the second medium 2. Accordingly, the frequency adjustment can be achieved more readily and reliably.

Preferably, the light absorption wavelength of the reform medium layer 4 may differ from the light absorption wavelength of the second medium 2, and light having a wavelength at which the reform medium layer 4 absorbs the light may be used as the above laser beam. In this case, during the laser beam irradiation, its energy is not absorbed in the second medium 2, and the reform medium layer 4 absorbs that energy and is reformed. Accordingly, the frequency adjustment can be readily and reliably achieved simply by selection of the wavelength of the laser beam.

The above-described laser beam can be various kinds of laser beams, such as an excimer laser and $CO_2$ laser, in addition to a femtosecond laser. The above-described energy capable of transmitting through the medium is not limited to the laser beam. Various kinds of active energy rays, such as heat rays, infrared rays, ultraviolet rays, X rays, and radiation, for example, can be used.

When a femtosecond laser is not used and a laser beam having a wavelength at which the reform medium layer 4 absorbs the laser beam is used, it is preferable that the reform medium layer 4 be made of a material whose light absorption wavelength is different from that of the second medium 2, as described above.

In the above preferred embodiments, energy for use in reforming is preferably provided to the second medium 2 from thereabove, not in the first medium 1. However, in contrast to this, the energy may be provided from below the first medium 2 and guided into the first medium 1 to perform reforming.

In the above preferred embodiments, the first medium 1 is preferably made of $LiNbO_3$, i.e., a piezoelectric material, so the first medium 1 has the property of exciting a boundary acoustic wave using piezoelectric effect. Accordingly, it is preferable that reforming be performed in the second medium 2, which is dielectric, not in the first medium 1.

Figure 8:
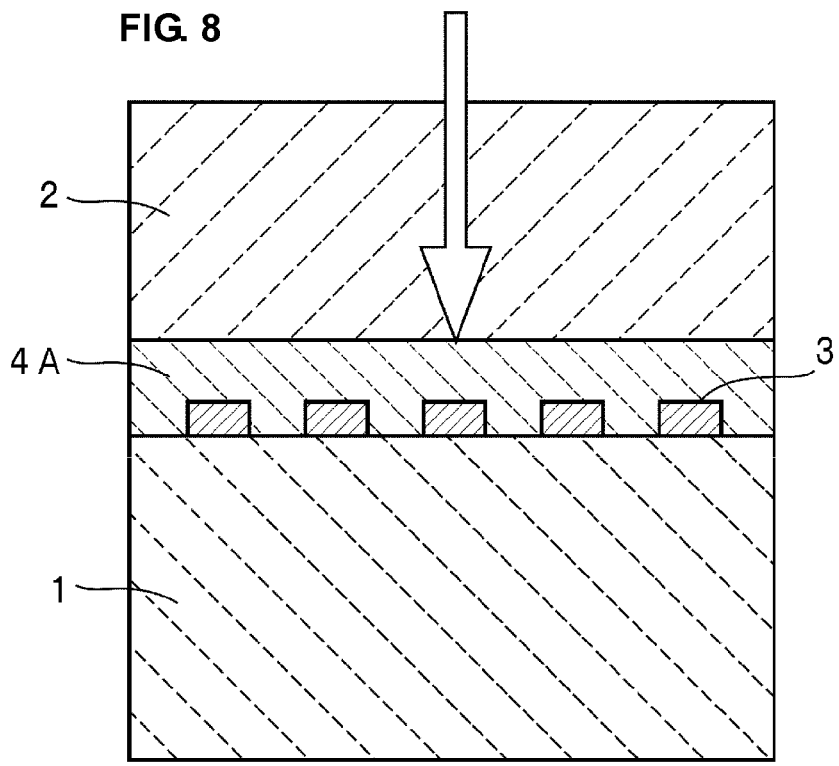
FIG. 8 is a schematic front cross-sectional view describing a modified example of a method for manufacturing a boundary acoustic wave device according to a preferred embodiment of the present invention.

As illustrated in the schematic front cross-sectional view of FIG. 8, a reform medium layer 4A may preferably be made of a dielectric material and arranged in contact with the IDT electrode 3. Here, the reform medium layer 4A is disposed so as to cover the IDT electrode 3 and arranged to replace a portion of the second medium 2 at a side of the interface X that is adjacent to the second medium 2. This structure is also included in the structure in which the interface X is disposed between the first medium 1 and the second medium 2 and the reform medium layer 4A is disposed within the second medium 2.

As described above, the reform medium layer 4A may be in contact with the interface X. In this case, in order to prevent a short circuit with the IDT electrode 3, it is preferable to make the reform medium layer 4A of an insulating material. The insulating material defining the reform medium layer 4A is not particularly limited so long as it is reformed by provided energy more readily than the second medium 2. Various insulating materials can be used. Examples thereof include a metallic oxide (e.g., zinc oxide (ZnO)), and a metallic nitride (e.g., SiN, aluminum nitride (AlN)).

Figure 9:
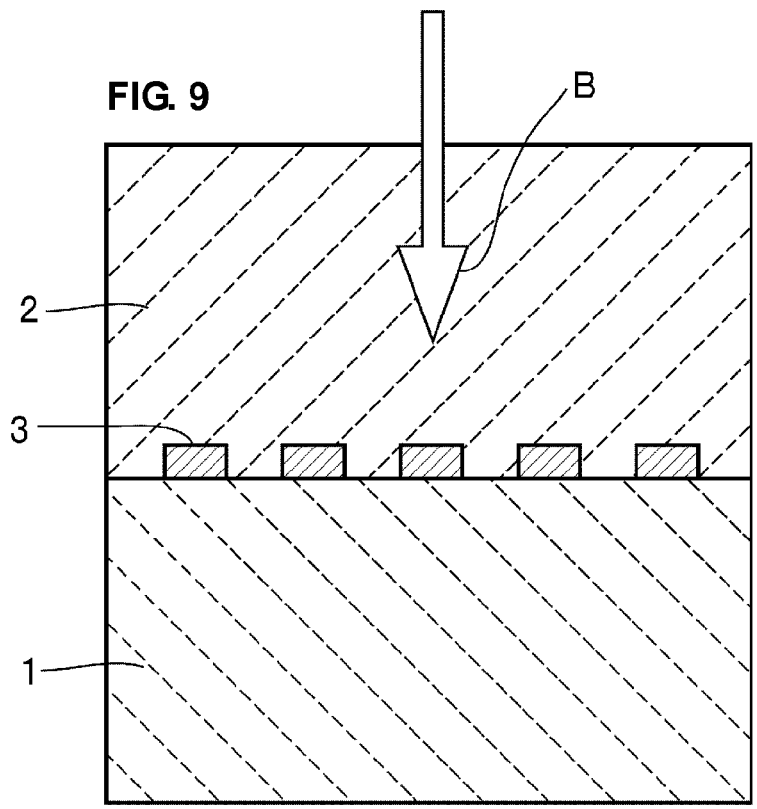
FIG. 9 is a schematic front cross-sectional view describing another modified example of a method for manufacturing a boundary acoustic wave device according to a preferred embodiment of the present invention.

As illustrated in FIG. 9, no reform medium layer may be disposed, and the frequency adjustment may be achieved by reforming a portion of the second medium 2 by irradiation of energy emitted from outside the second medium 2. In this case, the reformed portion can be disposed adjacent to the leading edge of the arrow B illustrated in FIG. 9 by focusing, for example, a laser beam on an area adjacent to the interface X. Accordingly, in the present invention, a reform medium layer is not necessarily required.

In the present invention, it is preferable that the reformed portion be arranged within a distance of λ from the interface X in the side in which the reformed portion is present. Accordingly, it is preferable that the reform medium layers 4 and 4A be also be arranged within a distance of λ from the interface X. A boundary acoustic wave propagates while concentrating its energy on a portion within a distance of λ from the interface X in the direction in which the first medium 1 and the second medium 2 are laminated. Accordingly, frequency characteristics can be effectively adjusted by the provision of the reformed portion and the reform medium layer in a region within ±λ from the interface X in a vertical direction.

In the above preferred embodiment, the reform medium layer 4 is preferably made of gold. However, a metal other than gold or an alloy may be used. In other words, the reform medium layer 4 can be made of any material that is diffused by provided energy and that achieves reforming. Examples of the above metal or alloy include, copper and silver, for example, in addition to gold. The first medium 1 made of $LiNbO_3$ may alternatively be made of another piezoelectric single crystal, such as, for example, $LiNbO_3$ having another cut angle and lithium tantalate ($LiTaO_3$). Alternatively, piezoelectric ceramics, such as lead zirconate titanate (PZT) ceramics, may also be used.

The second medium 2 may also be made of various kinds of insulating material and dielectric material, such as silicon, glass, and silicon carbide (SiC), for example, in addition to $SiO_2$. Alternatively, the second medium 2 may also be made of a piezoelectric material, such as ZnO, $Ta_2O_5$, PZT, $LiTaO_3$, and $LiNbO_3$, for example.

Each of the first medium and the second medium may be a structure in which a plurality of material layers is laminated.

Figure 10:
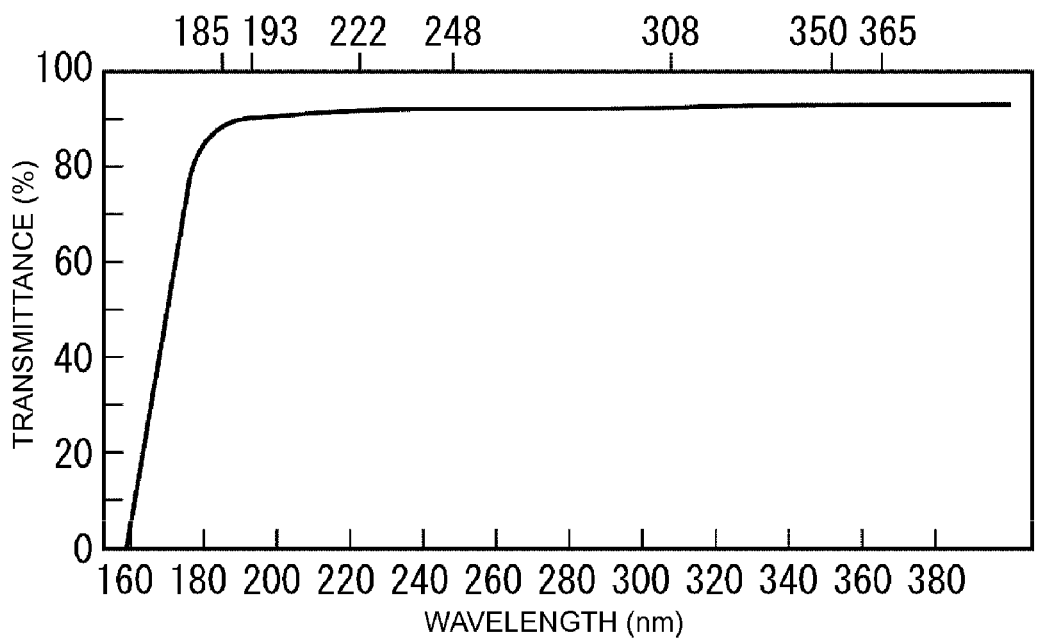
FIG. 10 illustrates dependence of transmittance of silicon dioxide on wavelength.
Figure 11:
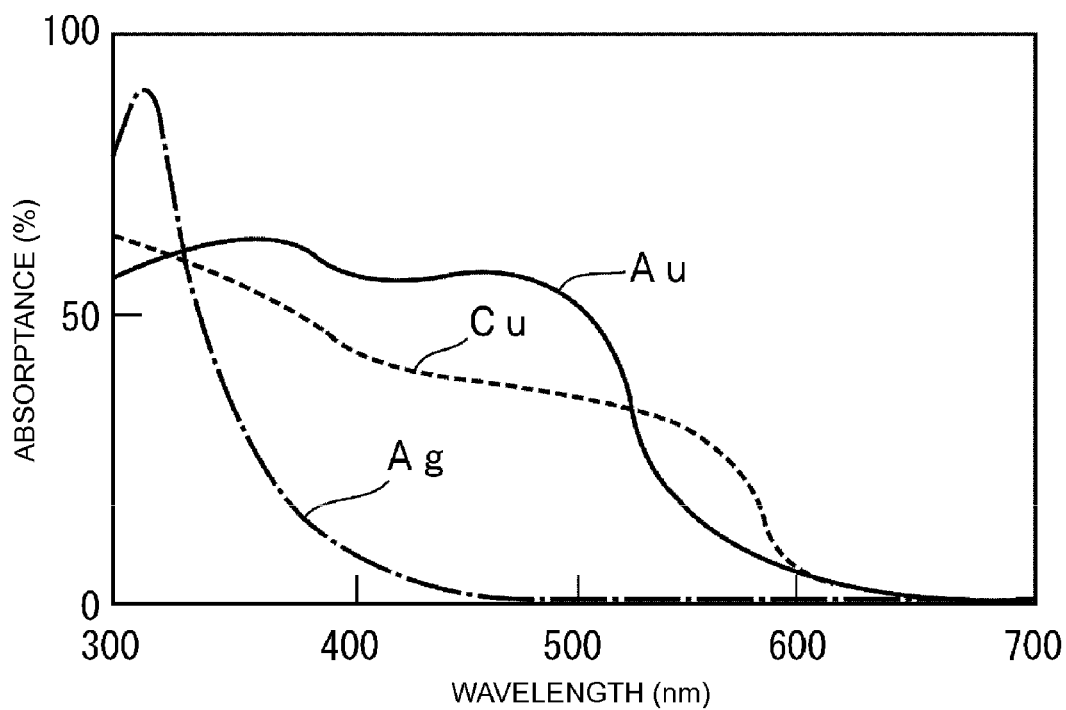
FIG. 11 illustrates dependence of absorptance of silver, copper, and gold on wavelength.
Figure 12:
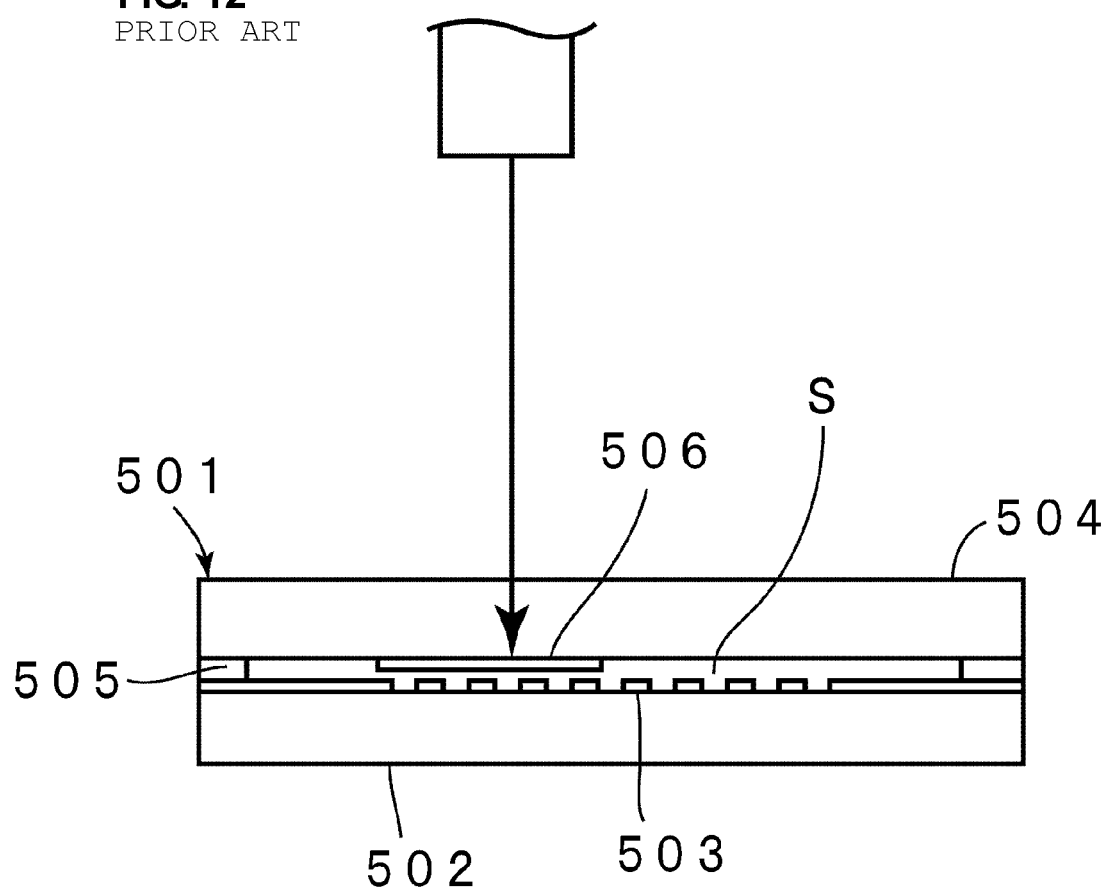
FIG. 12 is a schematic front cross-sectional view that illustrates one example of a frequency adjusting method for use in a conventional surface acoustic wave device.

FIG. 10 illustrates dependence of transmittance of $SiO_2$ forming the second medium 2 on wavelength. FIG. 11 illustrates dependence of absorptance of various metals on wavelength.

When the second medium 2 is made of $SiO_2$, light having a wavelength equal to or less than about 170 nm to about 180 nm is absorbed. In contrast to this, in the case of gold, as illustrated in FIG. 11, light having a wavelength equal to or greater than about 600 nm is reflected by approximately 100%, whereas, in a wavelength range less than about 600 nm, the absorptance is about 50%. Accordingly, when a laser beam having a wavelength greater than about 180 nm to transmit through the second medium 2 made of $SiO_2$ and having a wavelength less than 600 nm so as to be absorbed in the reform medium layer 4 is used, if the reform medium layer is made of gold, reforming can be performed by diffusion of gold, similar to the above preferred embodiment. One example of such a laser beam can be an excimer laser. As is clear from FIG. 11, the light absorption wavelength of copper and that of silver are different from that of the above-described $SiO_2$. Therefore, when the second medium is made of $SiO_2$, copper and silver can also be used in forming the reform medium layer within the second medium.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a boundary acoustic wave device comprising the steps of:
    preparing the boundary acoustic wave device including a first medium, a second medium laminated on the first medium, and an interdigital transducer electrode arranged at an interface between the first medium and the second medium and being in contact with both of the first medium and the second medium, the boundary acoustic wave device being arranged to utilize a boundary acoustic wave that propagates through the interface; and
    reforming at least one of the first medium and the second medium by externally providing the laminated structure with energy that reaches an inside portion that is spaced away from an outer surface of the at least one of the first medium and the second medium so as to adjust a frequency of the boundary acoustic wave device.

2. The method for manufacturing a boundary acoustic wave device according to claim 1, wherein, in the step of reforming the at least one of the first medium and the second medium by externally providing the at least one of the first medium and the second medium with the energy so as to adjust the frequency of the boundary acoustic wave device, the energy is concentrated on a portion of the at least one of the first medium and the second medium, and the portion of the at least one of the first medium and the second medium is thus reformed.

3. The method for manufacturing a boundary acoustic wave device according to claim 1, further comprising the step of forming a reform medium layer in at least one of the first medium and the second medium, wherein in the step of reforming the at least one of the first medium and the second medium so as to adjust the frequency, the reforming is performed by providing the energy to the reform medium layer.

4. The method for manufacturing a boundary acoustic wave device according to claim 3, wherein a light absorption wavelength of the reform medium layer is different from a light absorption wavelength of the at least one of the first medium and the second medium, in which the reform medium layer is disposed, the reforming is performed by concentration of a laser beam defining the energy on the reform medium layer, and the laser beam has a wavelength at which the reform medium layer absorbs the laser beam.

5. The method for manufacturing a boundary acoustic wave device according to claim 3, wherein each of the reform medium layer and the at least one of the first medium and the second medium is made of a material that is reformed by heat, and a temperature at which the reform medium layer reforms is lower than a temperature at which the at least one of the first medium and the second medium, in which the reform medium layer is disposed, reforms.

6. The method for manufacturing a boundary acoustic wave device according to claim 1, wherein, when a wavelength of the IDT electrode is λ, in reforming the at least one of the first medium and the second medium so as to adjust the frequency, the reforming is performed by providing the energy to a region within a distance of λ from the interface in a direction in which the first medium and the second medium are laminated.

7. The method for manufacturing a boundary acoustic wave device according to claim 1, wherein a femtosecond laser beam is used to supply the energy.

* * * * *